US008041197B2

(12) United States Patent
Kasai et al.

(10) Patent No.: US 8,041,197 B2
(45) Date of Patent: Oct. 18, 2011

(54) HEATING APPARATUS, HEAT TREATMENT APPARATUS, COMPUTER PROGRAM AND STORAGE MEDIUM

(75) Inventors: Shigeru Kasai, Minato-ku (JP); Tomohiro Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 365 days.

(21) Appl. No.: 12/120,637

(22) Filed: May 14, 2008

(65) Prior Publication Data

US 2008/0226272 A1 Sep. 18, 2008

Related U.S. Application Data

(63) Continuation of application No. PCT/JP2006/321764, filed on Oct. 31, 2006.

(30) Foreign Application Priority Data

Nov. 14, 2005 (JP) ................................. 2005-329381

(51) Int. Cl.
F26B 19/00 (2006.01)

(52) U.S. Cl. .......................... 392/418; 392/407; 392/411

(58) Field of Classification Search ........................ None
See application file for complete search history.

(56) References Cited

U.S. PATENT DOCUMENTS

| | | | |
|---|---|---|---|
| 4,435,092 A * | 3/1984 | Iuchi ............................. 374/129 |
| 4,975,561 A * | 12/1990 | Robinson et al. ............. 219/390 |
| 5,683,518 A * | 11/1997 | Moore et al. .................. 118/730 |
| 5,689,614 A | 11/1997 | Gronet et al. |
| 5,802,099 A * | 9/1998 | Curran et al. ................. 374/131 |
| 5,937,142 A * | 8/1999 | Moslehi et al. ............... 392/416 |
| 6,156,079 A * | 12/2000 | Ho et al. ....................... 29/25.01 |
| 6,210,484 B1 * | 4/2001 | Hathaway ..................... 118/724 |
| 6,376,804 B1 * | 4/2002 | Ranish et al. ................. 219/390 |
| 6,598,559 B1 * | 7/2003 | Vellore et al. ........... 118/723 VE |
| 6,639,189 B2 * | 10/2003 | Ramanan et al. .......... 219/444.1 |
| 6,818,864 B2 | 11/2004 | Ptak |
| 6,842,582 B2 * | 1/2005 | Morimoto et al. ............ 392/416 |
| 6,869,485 B2 * | 3/2005 | Halpin .......................... 118/725 |
| 7,112,763 B2 * | 9/2006 | Hunter et al. ................. 219/411 |
| 7,133,604 B1 * | 11/2006 | Bergstein ...................... 392/379 |
| 7,141,763 B2 * | 11/2006 | Moroz .......................... 219/390 |
| 2002/0186967 A1 * | 12/2002 | Ramanan et al. ............. 392/418 |
| 2004/0008980 A1 * | 1/2004 | Morimoto et al. ............ 392/418 |

(Continued)

FOREIGN PATENT DOCUMENTS

JP    2001-85408    3/2001

(Continued)

OTHER PUBLICATIONS

Office Acton issued Nov. 30, 2010, in Korean Patent Application No. 10-2008-7011511.

Primary Examiner — Thor Campbell
(74) Attorney, Agent, or Firm — Oblon, Spivak, McClelland, Maier & Neustadt, L.L.P.

(57) ABSTRACT

A heating apparatus for heating a target object W is provided with a plurality of heating light sources, including LED elements for applying heating light having a wavelength within a range from 360 to 520 nm to the object. Thus, a temperature of only the shallow surface of the object, such as a semiconductor wafer, is increased/reduced at a high speed in uniform temperature distribution, irrespective of the film type.

21 Claims, 9 Drawing Sheets

U.S. PATENT DOCUMENTS

2004/0253839 A1   12/2004   Shimizu et al.
2006/0213616 A1*  9/2006   Ogasawara .............. 156/345.24

FOREIGN PATENT DOCUMENTS

| | | |
|---|---|---|
| JP | 2003-77857 A | 3/2003 |
| JP | 2004-134674 | 4/2004 |
| JP | 2004-296245 A | 10/2004 |
| JP | 2005-011941 | 1/2005 |
| JP | 2005-101237 A | 4/2005 |
| JP | 2006-59931 A | 3/2006 |
| KR | 10-2004-0093686 | 8/2004 |
| WO | WO 2004/015348 A1 | 2/2004 |

* cited by examiner

HEATING APPARATUS, HEAT TREATMENT APPARATUS, COMPUTER PROGRAM AND STORAGE MEDIUM

This application is a Continuation Application of PCT International Application No. PCT/JP2006/321764 filed on Oct. 31, 2006, which designated the United States.

FIELD OF THE INVENTION

The present invention relates to a heating apparatus for irradiating heating light on a semiconductor wafer or the like, a single-wafer heat treatment apparatus for performing a specified heat treatment to a semiconductor wafer or the like through the use of the heating apparatus, a computer program and a storage medium.

BACKGROUND OF THE INVENTION

In the manufacture of semiconductor devices, it is typical that various kinds of heat treatments, such as film forming, pattern etching, oxidation/diffusion, reforming and annealing, are repeatedly performed to a semiconductor wafer to thereby manufacture desired devices. However, as the semiconductor devices become highly dense, multilayered and highly integrated, heat treatment methods grow more and more stringent year by year. In particular, there is a need to enhance wafer in-plane uniformity and improve a film quality therein during these heat treatments. In this regard, description will be given by taking as an example the treatment of channel layers or the like of a transistor, which is one of semiconductor devices. After ion-implanting impurity atoms into the channel layers or the like, annealing is usually carried out to stabilize the atomic structure thereof.

With reference to FIG. 13, a channel layer of a gate structure will be described as a representative example of a typical transistor structure. In FIG. 13, a source 2 and a drain 4, i.e., $p^+$ concentration regions, formed by doping p-type impurities are respectively configured on the surface of a semiconductor wafer W, e.g., an n-type silicon substrate formed by doping n-type impurities. Further, on the surfaces of the source 2 and the drain 4, there are formed $p^{++}$ regions 6 and 8 whose impurity concentration is greater than that of the $p^+$ regions. A gate electrode 12 made of, e.g., a polysilicon layer, is formed between the source 2 and the drain 4 through a gate insulating film 10 such as a silicon oxide film or the like.

Insulating layers 14 made of, e.g., SiN, are formed on the sidewalls of the gate electrode 12 and the gate insulating film 10. Such micro-transistor configured as described above is formed on a wafer surface in multiple numbers and other essential micro-elements are also configured on the wafer surface in multiple numbers. This transistor structure is merely an example and various kinds of films for different purposes are available depending on the intended uses. Further, annealing is performed as noted above, in order to stabilize the atomic structure of the regions in which impurities are doped.

In this case, if the annealing is performed for a prolonged period of time, the atomic structure becomes stable but impurity atoms are diffused deep into the film in a thickness direction thereof, eventually going downwards through the film. Accordingly, there is a need to perform the annealing as short as possible. That is to say, in order to stabilize the atomic structure while maintaining the thickness of the channel layer or the like thin and preventing the impurity atoms from going through the film, it is necessary to rapidly heat up the semiconductor wafer to an annealing temperature and, after annealing, to speedily cool down the wafer to a temperature that no diffusion occurs.

In order to accomplish such annealing, lamp annealing using a heating lamp has been generally employed in a conventional treatment apparatus (see, Patent Reference 1). For example, a halogen lamp or a flash lamp may be used as the heating lamp.

Another conventional treatment apparatus is disclosed in, e.g., Patent Reference 2, in which apparatus a Peltier element is provided on a wafer stage and is used to raise or lower a wafer temperature when etching a wafer at a temperature of 100 to 250° C.

Recently, an LED element or a laser developed to have a relatively high output power is used as a heat source or a light source (see, Patent References 3 to 5). The LED element or the laser generates far less heat in itself than does a heating lamp and has a significantly longer life and a lower heat capacity than those of the heating lamp. Therefore, the LED element or the laser is more likely used.

As an example, Patent Reference 3 discloses a lamp fabricated by combining a heat pipe and an LED element. Patent Reference 4 shows that resist is heated by an LED element or a laser. Patent Reference 5 teaches the use of an LED element array for CVD process.

[Patent Reference 1]
U.S. Pat. No. 5,689,614
[Patent Reference 2]
Japanese Laid-open Patent Application No. 2001-85408
[Patent Reference 3]
Japanese Laid-open Patent Application No. 2004-296245
[Patent Reference 4]
Japanese Laid-open Patent Application No. 2004-134674
[Patent Reference 5]
U.S. Pat. No. 6,818,864

As described above, when a heat treatment is performed, it is necessary not only to heat a wafer so that a temperature distribution on a wafer surface becomes uniform but also to raise and lower a wafer temperature within a short period of time.

Moreover, in order to meet the demands for high speed and ultrafine semiconductor devices, it is required that impurities be implanted shallowly into impurity implanted regions, such as the source 2 and the drain 4, at an increased concentration. When annealing the impurity implanted regions, therefore, it is required to perform temperature elevation and temperature reduction at an increased rate so that diffusion of the impurities in a substrate thickness direction can be suppressed as much as possible.

In case of an annealing treatment using a halogen lamp as a heating source, the halogen lamp emits long-wavelength heating light having a central wavelength of, e.g., 1 to 3 μm, and a broad wavelength band of 3 to 5 μm. This poses a problem in that, despite an intention to heat only a shallow portion under a wafer surface, the heating light reaches a deep position of the wafer and heats up a deep portion thereof, consequently allowing impurities to be diffused into the deep portion under the wafer surface.

Furthermore, since the light emitted from the halogen lamp has the long wavelength as noted above and unnecessarily heats up the deep portion under the wafer surface, heating efficiency is reduced and thus it is necessary to use high output power, thereby causing reduction in energy efficiency.

In case of an annealing treatment using a flash lamp as a heating source, the flash lamp projects light having a wavelength quite shorter than that of the halogen lamp. However, as can be seen from a wavelength band of the flash lamp shown in FIG. 14, the light of the flash lamp has a central wavelength of about 500 nm and a comparatively broad wavelength band of about 1 μm. Therefore, just like the halogen lamp set forth above, there is a problem in that the flash lamp heats up a deep portion of a wafer.

Applying a laser or an LED (Light Emitting Diode) element as a heating source makes it possible to avoid the above-noted problems and to heat, e.g., only a surface portion of a wafer in an efficient manner. However, in case of an ArF laser (an excimer laser having a central wavelength of 193 nm) and a KrF laser (an excimer laser having a central wavelength of 248 nm), both of which are representative lasers, the light irradiated from these lasers has a wavelength band width less than 1 μm which is too narrow, contrary to the foregoing cases. As a consequence, there is a problem in that a temperature difference which may cause lateral stresses in minute regions is generated or a wafer is locally melted, depending on the kinds of films or the wavelength of the light. Furthermore, since the cross-sectional area through which laser light passes is small, the laser light needs to be scanned by means of a scanning mechanism in order to heat the entire wafer surface. This entails a problem in that the structure thereof becomes complicated.

In case of the LED element, the wavelength of the emitted light has a band width of about 100 nm within a range from, e.g., 300 to 950 nm, although the band width depends on the kinds of LED elements employed. This means that the band width of the light emitted from the LED is wider than that of the laser but narrower than that of the flash lamp or the halogen lamp. Therefore, the LED element can reduce film-quality-dependent selectivity of a heating temperature and, consequently, has a feature of rather uniformly heating the surface portion of a wafer.

However, the mere use of the LED element does not guarantee optimization of the wavelength of the emitted light and, therefore, it is difficult to selectively and uniformly heat only the surface portion of a wafer in such a way that the depth of impurity diffusion regions is kept small and the concentration of impurities is kept high enough to meet the recent design rule requirement.

SUMMARY OF THE INVENTION

The present invention has been conceived in view of the problems mentioned above to effectively solve the problems. Therefore, the purpose of the present invention is to provide a heating apparatus capable of optimizing a wavelength of heating light emitted from an LED element and thus rapidly heating up and cooling down only a shallow surface portion of a target object such as a semiconductor wafer or the like, while maintaining a uniform temperature distribution regardless of the kinds of films. The present invention further provides a heat treatment apparatus using same, a computer program and a storage medium.

In accordance with a first aspect of the present invention there is provided a heating apparatus for heating a target object, including a plurality of heating light sources having LED (Light Emitting Diode) elements each for emitting a heating light beam toward the object, the heating light beam having a wavelength in a range from 360 to 520 nm.

Due to applying a plurality of heating light sources each including an LED element that emits heating light with a wavelength of 360 to 520 nm toward a target object, the wavelength of the heating light is optimized. As a result, it is possible to rapidly heat up and cool down only a surface of the object such as a semiconductor wafer or the like, with a reduced thickness and under a uniform temperature distribution state regardless of the kinds of films.

It is preferable that the LED elements include at least one of ultraviolet LED elements for emitting ultraviolet light, purple LED elements for emitting purple light and blue LED elements for emitting blue light.

Further, the blue LED elements may emit the heating light having a central wavelength of 470 nm.

It is also preferable that the heating apparatus further includes first reflectors provided correspondingly to the respective heating light sources to reflect the light beams from the heating light sources toward the object.

Further, the light beams reflected from the first reflectors may be adapted to be respectively collected onto different regions of the object.

Further, each of the first reflectors may also have a reflection surface formed into a curved surface shape.

Furthermore, each of the first reflectors may be made of aluminum or formed by coating a magnesium fluoride film on an aluminum surface.

It is also preferable that each of the heating light sources includes an element attachment rod formed of a heat pipe, the LED elements being attached to tip portions of the element attachment rods.

It is still also preferable that each of the heating light sources includes a base portion supported by a housing.

Further, the housing may be formed into a dome shape and has an inner curved reflection surface serving as a second reflector.

Further, the second reflector may also be made of aluminum or formed by coating a magnesium fluoride film on an aluminum surface.

It is preferable that an attachment rod cooling unit for cooling the base portion of each of the heating light sources is provided in the housing.

It is also preferable that the element attachment rod of each of the heating light sources is configured to extend in a direction perpendicular to a surface of the object or in a direction approximate to the perpendicular direction.

Further, the heating apparatus may also include a radiation thermometer for measuring a temperature of the object, the radiation thermometer measuring a wavelength band different from a wavelength band of the light beams emitted from the LED elements.

In accordance with a second aspect of the present invention there is provided a heat treatment apparatus for performing a specified heat treatment to a target object, including: an exhaustible processing chamber having an open ceiling portion; a mounting table provided within the processing chamber for supporting the object on an upper surface thereof; a light transmission window for air-tightly covering the ceiling portion of the processing chamber; a gas introducing unit for introducing a required gas into the processing chamber; and a heating apparatus provided above the light transmission window for emitting heating light toward the object, wherein the heating apparatus includes a heating light source having an LED element for emitting heating light toward the object, the heating light having a wavelength in a range from 360 to 520 nm.

It is preferable that a plurality of thermoelectric conversion devices is provided in an upper portion of the mounting table.

It is also preferable that a heat medium flow passage for, if necessary, allowing heat medium to flow through the passage is provided in the table.

Further, the heat treatment apparatus may also include a control unit for controlling an overall operation of the heat treatment apparatus, wherein the control unit controls the heat treatment apparatus in such a way that, when heating the object, the heating apparatus is turned on and an electric current is allowed to flow through the thermoelectric conversion devices in such a direction as to heat the object while, when cooling the object, the heating apparatus is turned off and an electric current is allowed to flow through the thermoelectric conversion devices in such a direction as to cool the object.

Further, the heat treatment apparatus may also include a control unit for controlling an overall operation of the heat treatment apparatus wherein the control unit controls the heat treatment apparatus in such a way that, when heating the object, the thermoelectric conversion devices are first turned on to preheat the object by allowing an electric current to flow in such a direction as to heat the object and then the heating apparatus is turned on while, when cooling the object, the heating apparatus is turned off and an electric current is allowed to flow through the thermoelectric conversion devices in such a direction as to cool the object.

It is preferable that the control unit is capable of controlling electric current directions and electric powers of the thermoelectric conversion devices independently and, when heating the object, the control unit controls the heat treatment apparatus in such a way that the thermoelectric conversion devices are independently heated or cooled to thereby increase in-plane temperature uniformity of the object.

It is also preferable that the light transmission window is made of quartz glass.

In accordance with a third aspect of the present invention there is provided a computer program for controlling a heat treatment apparatus for performing a specified heat treatment to a target object, the heat treatment apparatus including: an exhaustible processing chamber having an open ceiling portion; a mounting table provided within the processing chamber for supporting the object on an upper surface thereof; a light transmission window for air-tightly covering the ceiling portion of the processing chamber; a gas introducing unit for introducing a required gas into the processing chamber; and a heating apparatus provided above the light transmission window for emitting heating light toward the object, wherein the heating apparatus comprises a heating light source including an LED element for emitting heating light toward the object, the heating light having a wavelength in a range from 360 to 520 nm, and wherein a plurality of thermoelectric conversion devices is provided in an upper portion of the mounting table, wherein the computer program controls the heat treatment apparatus to perform the specified heat treatment in such a way that, when heating the object, the heating apparatus is turned on and an electric current is allowed to flow through the thermoelectric conversion devices in such a direction as to heat the object while, when cooling the object, the heating apparatus is turned off and an electric current is allowed to flow through the thermoelectric conversion devices in such a direction as to cool the object.

In accordance with still a forth aspect of the present invention there is provided a computer program for controlling a heat treatment apparatus for performing a specified heat treatment to a target object, the heat treatment apparatus including: an exhaustible processing chamber having an open ceiling portion; a mounting table provided within the processing chamber for supporting the object on an upper surface thereof; a light transmission window for air-tightly covering the ceiling portion of the processing chamber; a gas introducing unit for introducing a required gas into the processing chamber; and a heating apparatus provided above the light transmission window for emitting heating light toward the object, wherein the heating apparatus comprises a heating light source including an LED element for emitting heating light toward the object, the heating light having a wavelength in a range from 360 to 520 nm, and wherein a plurality of thermoelectric conversion devices is provided in an upper portion of the mounting table, wherein the computer program controls the heat treatment apparatus to perform the specified heat treatment in such a way that, when heating the object, the thermoelectric conversion devices are first turned on to preheat the object by allowing an electric current to flow in such a direction as to heat the object and then the heating apparatus is turned on while, when cooling the object, the heating apparatus is turned off and an electric current is allowed to flow through the thermoelectric conversion devices in such a direction as to cool the object.

In accordance with still a fifth aspect of the present invention there is provided a storage medium storing a computer program for controlling a heat treatment apparatus for performing a specified heat treatment to a target object, the heat treatment apparatus including: an exhaustible processing chamber having an open ceiling portion; a mounting table provided within the processing chamber for supporting the object on an upper surface thereof; a light transmission window for air-tightly covering the ceiling portion of the processing chamber; a gas introducing unit for introducing a required gas into the processing chamber; and a heating apparatus provided above the light transmission window for emitting heating light toward the object, wherein the heating apparatus comprises a heating light source including an LED element for emitting heating light toward the object, the heating light having a wavelength in a range from 360 to 520 nm, and wherein a plurality of thermoelectric conversion devices is provided in an upper portion of the mounting table, wherein the computer program controls the heat treatment apparatus to perform the specified heat treatment in such a way that, when heating the object, the heating apparatus is turned on and an electric current is allowed to flow through the thermoelectric conversion devices in such a direction as to heat the object while, when cooling the object, the heating apparatus is turned off and an electric current is allowed to flow through the thermoelectric conversion devices in such a direction as to cool the object.

In accordance with still a sixth aspect of the present invention there is provided a storage medium storing a computer program for controlling a heat treatment apparatus for performing a specified heat treatment to a target object, the heat treatment apparatus including: an exhaustible processing chamber having an open ceiling portion; a mounting table provided within the processing chamber for supporting the object on an upper surface thereof; a light transmission window for air-tightly covering the ceiling portion of the processing chamber; a gas introducing unit for introducing a required gas into the processing chamber; and a heating apparatus provided above the light transmission window for emitting heating light toward the object, wherein the heating apparatus comprises a heating light source including an LED element for emitting heating light toward the object, the heating light having a wavelength in a range from 360 to 520 nm, and wherein a plurality of thermoelectric conversion devices is provided in an upper portion of the table, wherein the computer program controls the heat treatment apparatus to perform the specified heat treatment in such a way that, when heating the object, the thermoelectric conversion devices are first turned on to preheat the object by allowing an electric current to flow in such a direction as to heat the object and then the heating apparatus is turned on while, when cooling the object, the heating apparatus is turned off and an electric current is allowed to flow through the thermoelectric conversion devices in such a direction as to cool the object.

The heating apparatus, the heat treatment apparatus using the same, the computer program and the storage medium in accordance with the present invention are capable of accomplishing superior operational effects as follows.

Due to applying a plurality of heating light sources each including an LED element that emits heating light with a wavelength of 360 to 520 nm toward a target object, the wavelength of the heating light is optimized. As a result, it is possible to rapidly heat up and cool down only a surface of the object such as a semiconductor wafer or the like, with a reduced thickness and under a uniform temperature distribution state regardless of the kinds of films.

DETAILED DESCRIPTION OF THE EMBODIMENTS

Hereinafter, one embodiment of a heating apparatus, a heat treatment apparatus and a storage medium in accordance with the present invention will be described in detail with reference to the accompanying drawings.

Figure 1:
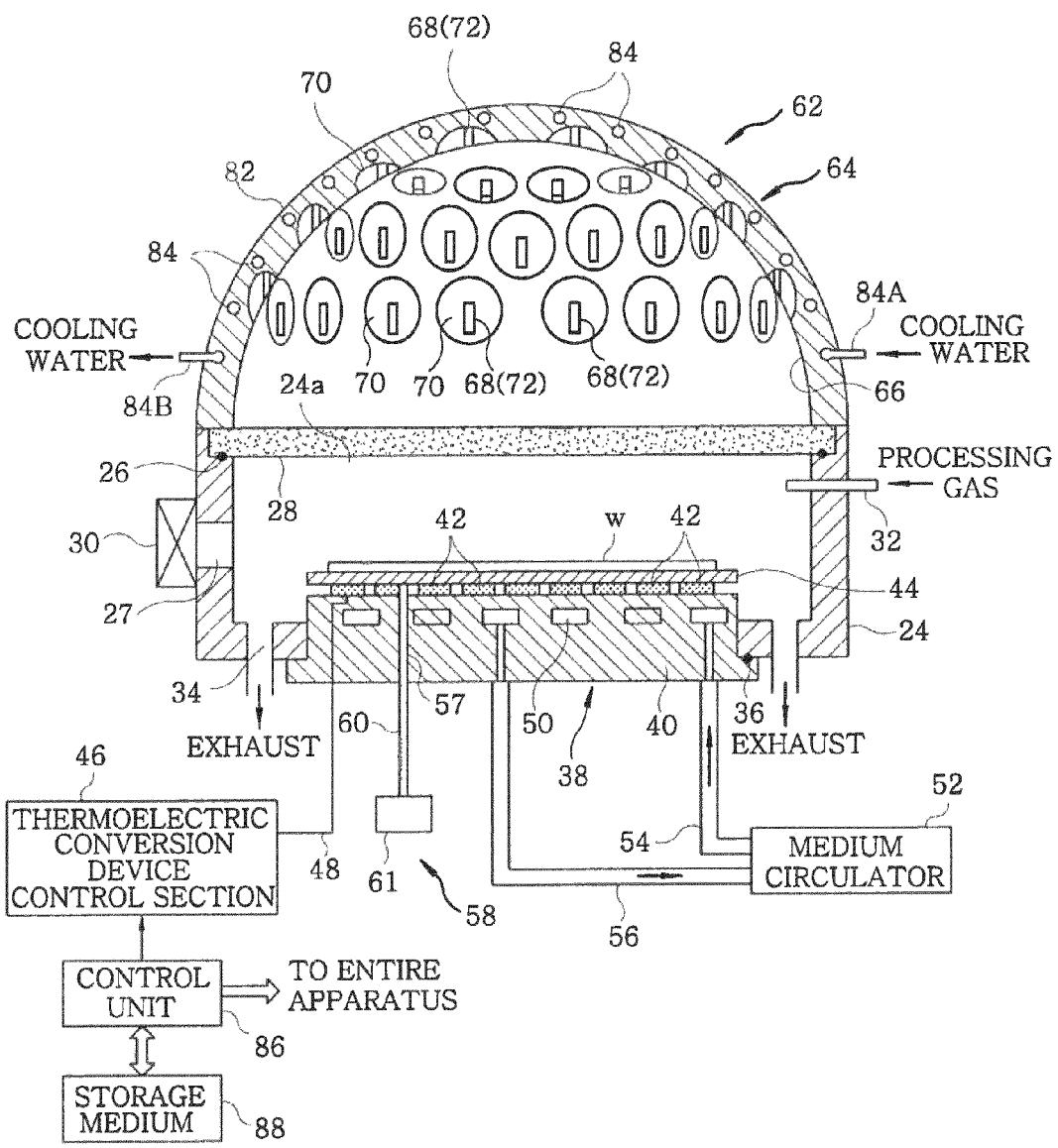
FIG. 1 is a cross sectional configuration view showing one example of a heat treatment apparatus in accordance with the present invention.
Figure 2:
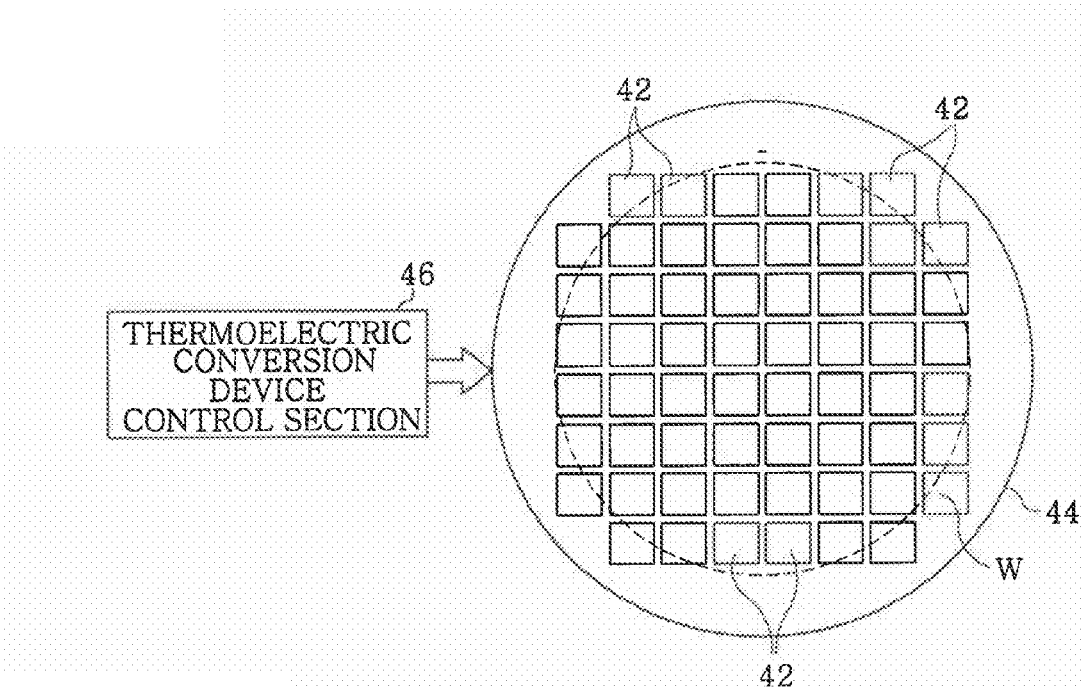
FIG. 2 is a plan view illustrating an arrangement state of thermoelectric conversion devices.
Figure 3:
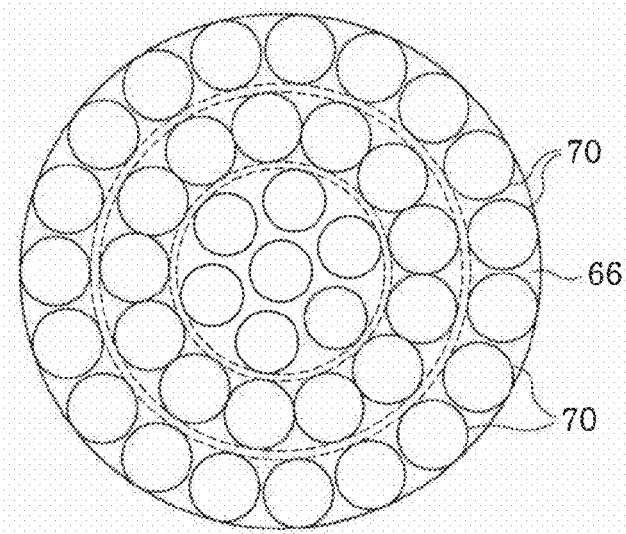
FIG. 3 is a view illustrating an arrangement of reflectors when a heating apparatus is viewed from a mounting table.
Figure 4:
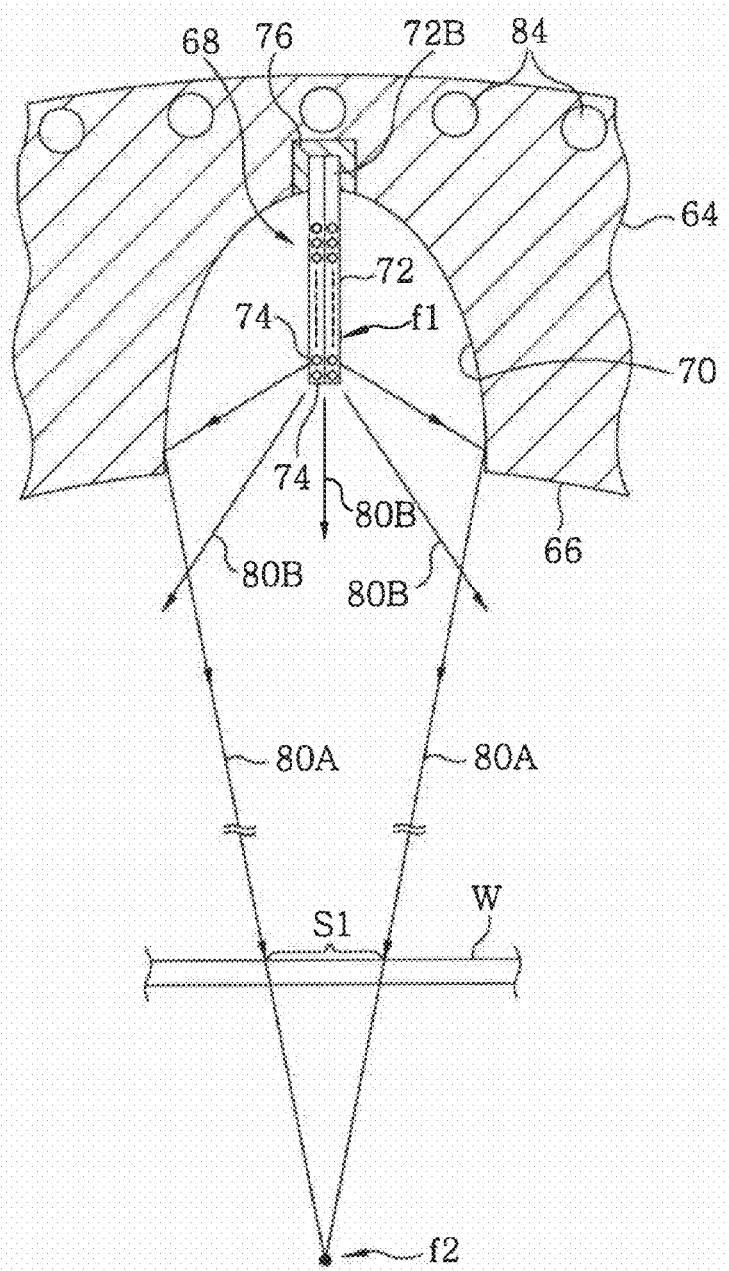
FIG. 4 is a view illustrating a path of heating light emitted from semiconductor light emitting devices of a heating light source.
Figure 5:
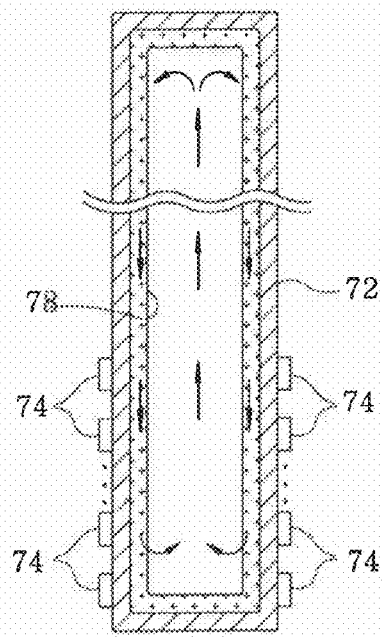
FIG. 5 is an enlarged cross sectional view showing an element attachment rod to which the semiconductor light emitting devices are attached.
Figure 6:
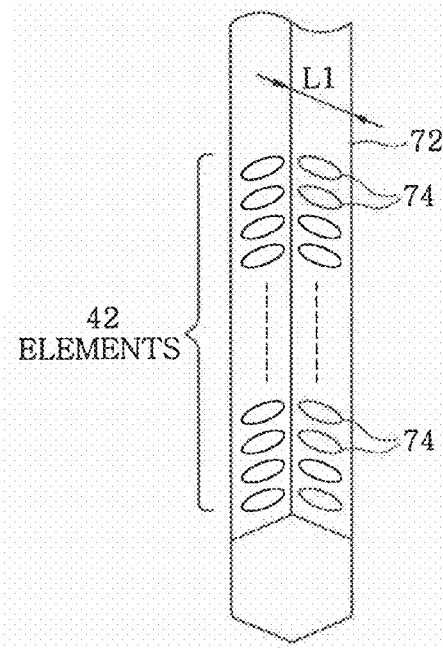
FIG. 6 is an enlarged perspective view showing a tip end portion of the element attachment rod.

FIG. 1 is a cross sectional configuration view showing one example of a heat treatment apparatus in accordance with the present invention; FIG. 2 is a plan view illustrating an arrangement state of thermoelectric conversion devices; FIG. 3 is a view illustrating an arrangement of reflectors when a heating apparatus is viewed from a table; FIG. 4 is a view illustrating a path of heating light emitted from semiconductor light emitting devices of a heating light source; FIG. 5 is an enlarged cross sectional view showing an element attachment rod to which the semiconductor light emitting devices are attached; and FIG. 6 is an enlarged perspective view showing a tip end portion of the element attachment rod.

Referring to FIG. 1, a heat treatment apparatus 22 includes a processing chamber 24 formed of, e.g., aluminum, into a hollow body shape with an open ceiling portion 24a, and a mounting table 38 provided in the processing chamber 24 for supporting a semiconductor wafer (a target object) W on its top surface. The processing chamber 24 is designed to have a size capable of receiving a wafer of, e.g., 300 mm in diameter. The ceiling portion 24a of the processing chamber 24 is opened and a light transmission window 28 transparent to the below-mentioned heating light is air-tightly provided in the open ceiling portion 24a through a sealing member 26 such as an O-ring or the like. As a material of the light transmission window 28, the use is made of, e.g., quartz glass particularly transparent to the wavelength of the heating light used in the present invention.

An opening 27 is formed on one sidewall of the processing chamber 24 and a gate valve 30 opened and closed when loading and unloading the semiconductor wafer W is provided in the opening 27. On the other sidewall of the processing chamber 24, there is provided a gas nozzle 32 that serves as a gas introducing unit for introducing a required gas into the processing chamber 24. A gas exhaust port 34 is formed in a bottom peripheral portion of the processing chamber 24 and a gas exhaust system is connected to the gas exhaust port 34 through a vacuum pump (not shown) so that the processing chamber 24 can be exhausted into, e.g., a vacuum atmosphere. Alternatively, the interior of the processing chamber 24 may be kept in an atmospheric pressure or so, depending on the kind of processing. The bottom portion of the processing chamber 24 is opened in a large size and the mounting table 38 of an increased thickness playing a role of the bottom portion is air-tightly attached and secured to the large-size opening through a sealing member 36, e.g., an O-ring, as noted above.

The mounting table 38 includes a table main body 40 of an increased thickness made of, e.g., aluminum, a plurality of thermoelectric conversion devices 42 provided on the top portion thereof and a support plate 44 of a thin disc shape installed on an upper surface of the thermoelectric conversion devices 42. The semiconductor wafer W as an object to be processed is directly placed on the mounting table 38. More specifically, as for the thermoelectric conversion devices 42, the use is made of, e.g., Peltier elements. The Peltier elements are elements where heat other than Joule heat is generated or absorbed in the contact points thereof, if an electric current is caused to flow through different kinds of conductors or semiconductors serially connected by electrodes. The Peltier elements are formed of $Bi_2Te_3$ (bismuth telluride) elements capable of putting up with the use at a temperature of, e.g., 200° C. or less, PbTe (lead telluride) elements or SiGe (silicon germanium) elements, wherein the latter two are usable at a relatively high temperature. The Peltier elements are electrically connected to a thermoelectric conversion device control section 46 via a lead line 48. The thermoelectric conversion device control section 46 is adapted to control the direction and magnitude of an electric current supplied to the thermoelectric conversion devices 42 when heat-treating the wafer W.

FIG. 2 shows an exemplary arrangement of the thermoelectric conversion devices 42 formed of the Peltier elements. In FIG. 2, there is shown an arrangement example where sixty thermoelectric conversion devices 42 are closely arranged on the substantially entire bottom surface of the support plate 44 in alignment with the wafer W having a diameter of 300 mm. If the thermoelectric conversion devices 42 are closely arranged in this way, it becomes possible to uniformly heat the wafer W and the support plate 44. The shape of the thermoelectric conversion devices 42 is not limited to be rectangular but may be circular or hexagonal. In this regard, the term "thermoelectric conversion" means that heat energy is converted to electric energy and vice versa. The thermoelectric conversion devices 42 described herein may not be provided in case it is designed to perform a necessary heat treatment only in the heating apparatus using the below-mentioned LED element, which constitutes a feature of the present invention.

Referring back to FIG. 1, a heat medium flow passage 50 is formed within the table main body 40 over the substantially entire region of the latter in a plane direction. The heat medium flow passage 50 is provided below the thermoelectric conversion devices 42 to ensure that, in a cooldown process of the wafer W, coolant (water) as a heat medium can be supplied through the heat medium flow passage 50 to take away hot thermal energy from the lower surfaces of the thermoelectric conversion devices 42 and thus cool down the latter. In a heatup process of the wafer W, if necessary, a hot medium is supplied through the heat medium flow passage 50 to take away cold thermal energy from the lower surfaces of the thermoelectric conversion devices 42 and thus heat up the latter. The heat medium flow passage 50 is connected to a medium circulator 52 for feeding the heat medium, through a heat medium introducing pipe 54 and a heat medium discharging pipe 56. This allows the medium circulator 52 to circulate the heat medium in the heat medium flow passage 50.

The support plate 44 mounted on the thermoelectric conversion devices 42 is made of a material such as $SiO_2$, AlN, SiC, Ge, Si or metal. An elevator mechanism (not shown) for lifting and lowering the wafer W is provided in the mounting table 38. The elevator mechanism includes a plurality of vertically movable support pins extending through the table main body 40 and the support plate 44 to support the wafer W from a lower side thereof and a drive device for vertically moving the support pins.

The table main body 40 has a through-hole 57 extending through the thickness thereof in a vertical direction. A radiation thermometer 58 is installed in the through-hole 57. Specifically, an optical fiber 60 is air-tightly inserted into the through-hole 57 to extend to a lower surface of the support plate 44 so that it can guide the light radiating from the support plate 44. A radiation thermometer main body 61 is coupled to an end portion of the optical fiber 60 and is adapted to measure a temperature of the support plate 44, i.e., a wafer temperature, from the light of a specified measurement wavelength band. In this regard, the measurement wavelength band of the radiation thermometer 58 is set differently from a wavelength band of the light emitted from the below-mentioned LED element.

A heating apparatus 62 for irradiating heating light toward the wafer W is provided above the light transmission window 28 of the processing chamber 24. Specifically, the heating apparatus 62 includes a dome-shaped housing 64 configured to cover the upper side of the light transmission window 28. The dome-shaped housing 64 is made of a material exhibiting superior heat conductivity, such as aluminum (including aluminum alloy) or copper, and is formed into, e.g., a hemispherical shape as a whole. A part of the lower end portion of the housing 64 is coupled to a part of the upper end portion of the processing chamber 24 by means of a hinge (not shown) so that the housing 64 can be opened.

The inner surface of the housing 64 is formed as a high-reflectivity reflecting surface coated with a magnesium fluoride ($MgF_2$) film or plated with gold. The reflecting surface of the housing 64 serves as a second reflector 66. It is particularly preferable to use, as the second reflector 66, an aluminum surface (including an aluminum alloy surface) coated with a magnesium fluoride film, as will be described later. A plurality of heating light sources 68 is attached to the inner surface side of the housing 64 to emit heating light (light beams). The heating light sources 68 are relatively evenly distributed over the substantially entire region of the inner surface of the dome-shaped housing 64. In the illustrated embodiment, the number of the heating light sources 68 is thirty nine (39) in total. The heating light sources 68 are not shown in FIG. 3.

As shown in FIGS. 3 and 4, a plurality of first reflectors 70 each having a concave shape is each provided in each of the heating light sources 68. The first reflectors 70 have inner surfaces each formed of, e.g., a high-reflectivity reflecting surface coated with a magnesium fluoride film or plated with gold. Just like the second reflector 66, it is particularly preferable for each first reflector 70 to use an aluminum surface (including an aluminum alloy surface) coated with a magnesium fluoride film. The openings of the first reflectors 70 are each formed into a circular or elliptical shape. The openings of the respective first reflectors 70 are designed to have the same projection shape when viewed from the bottom side thereof, i.e., the side of the mounting table 38. By forming the housing 64 into a dome-like curved surface shape as set forth above, it is possible to attach the heating light sources 68 in a greater number than when the housing 64 has a planar shape and, consequently, to input increased electric power for heating purpose.

As illustrated in FIGS. 5 and 6, the heating light sources 68 each include an element attachment rod 72 of a small rod shape and a plurality of LED elements 74 attached to the element attachment rod 72 nearly along the entire length thereof, the LED elements 74 constituting a feature of the present invention. The element attachment rods 72 each has a base portion 72B coupled and fastened to a connection terminal 76 (see, FIG. 4) which is provided in a central portion of each first reflector 70 of the housing 64. This makes it possible to support and fix the element attachment rods 72 in place and to supply necessary electric power to the LED elements 74. The connection terminals 76 are connected to an electric power source system via wiring lines (not shown). In this way, most of the element attachment rods 72 are provided to extend in a direction perpendicular to the surface of the wafer W or in a direction substantially parallel to this perpendicular direction.

In the present invention, LED elements that emit a heating light beam whose wavelength is in a range from 360 to 520 nm (corresponding to ultraviolet light, purple light and blue light) are used as the LED elements 74. As will be described later, this makes it possible to rapidly heat up and cool down the wafer W regardless of the kinds of films formed on the wafer surface, while maintaining in-plane temperature uniformity. That is to say, blue-light LED elements mainly outputting a blue light beam or purple-light LED elements mainly outputting a purple light beam are used as the LED elements 74. Typical LED elements emit a light beam whose wavelength has a bandwidth of about 100 nm.

The element attachment rod 72 is formed of, e.g., a hollow heat pipe. As shown in FIG. 5, a wick 78 is bonded to an inner surface of the element attachment rod 72 and a working fluid is sealingly filled in the interior thereof. The element attachment rod 72 is made of a metallic material of superior heat conductivity, e.g., aluminum or copper. The element attachment rod 72 is formed into a polygonal shape, e.g., a hexagonal shape as shown in FIG. 6. The LED elements 74 are collectively attached nearly to the entire side surfaces of the corresponding element attachment rod 72. The LED elements 74 have a total size which can be regarded as a point light source. According to the state-of-the-art technology, the LED elements 74 already have been developed as elements that can produce high output power per unit element. For example, there has been developed an LED element capable of producing high output power of 30 W per unit element at the greatest. In the illustrated embodiment, forty two LED elements 74 are arranged on each surface of one hexagonal element attachment rod 72, which means that two hundred fifty two (42 elements×6 columns) LED elements 74 are attached to one element attachment rod 72.

Assuming that a single LED element 74 has an output power of 7.5 W (Watt), it is possible for a single heating light source 68 to produce high output power of 1890 W (7.5 W×252). Assuming that the total number of the heating light sources 68 are thirty nine as set forth above, the total output power becomes 73.71 kW (1890 W×39). This output power is the energy required in obtaining a wafer heatup rate of 1000° C./sec. Wiring lines (not shown) for electrically connecting the connection terminal 76 with the respective LED elements 74 are provided in each element attachment rod 72 in itself.

In this connection, each element attachment rod 72 has such a quite small size that the entire length thereof is about 60 mm and the length (L1) of one side of the hexagon is about 1 to 3 mm.

Referring to FIG. 4, if the curved surfaces of the first reflectors 70 are assumed to be spheroids having two focal points f1 and f2 and if a group of the LED elements 74 of the heating light source 68, which can be regarded as a point light source, is installed at the first focal point f1, the reflected light beams 80A emitted from the heating light source 68 and reflected at the first reflector 70 are collected at the second focal point f2. Inasmuch as the heating light sources 68 are not perfect point light sources in fact, some of the reflected light beams 80A emitted from the heating light source 68 and reflected at the first reflector 70 are not collected at the second focal point f2 but are diffused and irradiated on the vicinity of the second focal point f2. Furthermore, some of the direct light beams 80B projecting from the heating light source 68 but failing to reach the first reflector 70 are directly irradiated on the surface of the wafer W, whereas other light beams are led to and reflected at the second reflector 66 and then irradiated on the surface of the wafer W. About 70% at the greatest of the light beams irradiating the wafer W are absorbed by the wafer W and the remainders are reflected by the wafer W or penetrate the wafer W. The reflected light beams are once again irradiated on the wafer W after reflecting at the second reflector 66. The direct light beams irradiating the mounting table 38 or the support plate 44 induce a light loss. The quantity of the light loss can be kept as small as possible by changing the size, inclination, opening diameter and the like of the first reflectors 70.

The number of the heating light sources 68 is determined by the size of the wafer W, the area S1 of the wafer W irradiated by a single heating light source, the design requirements for a heatup rate of the wafer W, the total power of the heating light sources 68, the diameter of the second reflector 66, and so forth.

In this regard, the regions of the wafer W irradiated by the respective heating light sources 68, each of which have the area S1, are set to ensure that the light projecting from the respective heating light sources 68 can shine on different regions on the surface of the wafer W, thereby covering the entire surface region of the wafer W.

Referring back to FIG. 1, an attachment rod cooling unit 82 for cooling the base portions of the element attachment rods 72 is provided in the housing 64 having the heating light sources 68. Specifically, the attachment rod cooling unit 82 has a coolant passage 84 formed to extend near the base portions of the element attachment rods 72. The coolant passage 84 has a coolant inlet 84A for introducing a coolant, e.g., cooling water, and a coolant outlet 84B for discharging the coolant. Alternatively, the internal space of the housing 64 may be cooled by the air. In order not to generate any stray light that may cause measurement errors, the measurement wavelength band of the radiation thermometer 58 is set to differ from the wavelength (360 to 520 nm) of the light emitted by the LED elements 74. For example, a wavelength of about 3 µm may be set as the measurement wavelength band.

The entire heat treatment apparatus 22 is controlled by a control unit 86 including, e.g., microcomputer or the like. The control unit 86 has a storage medium 88 storing a program for controlling the overall operation of the apparatus. The storage medium 88 includes, e.g., a flexible disk, a flash memory, a hard disk, a DVD, a CD-ROM or the like.

Next, description will be given on the heat treatment operations for the wafer W performed by the heat treatment apparatus 22 configured as above. The operations described below are carried out based on the program stored in the storage medium 88. Description will be made herein by taking as an example a case wherein the wafer W having an impurity-implanted surface is subjected to annealing.

First, general operations will be set forth. The gate valve 30 provided at the sidewall of the processing chamber 24 is opened. The wafer W to be processed is loaded into the processing chamber 24 through the opening 27 and is placed on the support plate 44 of the mounting table 38. Then, the gate valve 30 is closed to seal off the processing chamber 24. Subsequently, the interior of the processing chamber 24 is vacuum-exhausted by means of the exhaust device and filled with a processing gas, e.g., argon gas or nitrogen gas, supplied from the gas supply source, thereby keeping the interior of the processing chamber 24 at a specified process pressure (e.g., 100 to 10000 Pa).

Next, the wafer W is preheated by energizing the thermoelectric conversion devices 42 including Peltier elements. The preheating temperature is about 500 to 600° C. where there is no diffusion of the impurities implanted into the wafer W.

The temperature of the wafer W is being detected by the radiation thermometer 58. If the radiation thermometer 58 detects a specified preheating temperature, all the heating light sources 68 of the heating apparatus 62 are turned on to allow the respective LED elements 74 to emit light. The light is irradiated on the surface of the wafer W to instantaneously heat up the same to a specified processing temperature (e.g., 1000° C.). At this moment, the electric power supplied to the thermoelectric conversion devices 42 reaches, e.g., a fully elevated power level, thereby rapidly heating up the wafer W from the upper and lower surfaces thereof. In case there is no need to preheat the wafer W by the thermoelectric conversion devices 42, it may be possible to turn on the heating light sources 68 simultaneously with an energization of the thermoelectric conversion devices 42.

If the in-plane temperature uniformity of the wafer W is particularly important, the direction and power of an electric current supplied to each of the thermoelectric conversion devices 42 may be separately controlled to enable each of the thermoelectric conversion devices 42 to perform heating and cooling operations independently from one another, thus compensating non-uniformity of heat generated by the heating light sources 68 of the heating apparatus 62. This makes it possible to further enhance the in-plane temperature uniformity of the wafer.

In case the thermoelectric conversion devices 42 are not provided in the mounting table 38, the preheating and the heatup to the processing temperature are performed by operating the heating apparatus 62. Then, annealing is carried out by maintaining the high temperature state for a predetermined period of time. Since the wafer W is heated in the above-noted manner, it is possible to increase the heatup rate to about 100-1000° C./sec, thereby realizing high speed heatup.

In particular, thanks to the fact that the heating light sources 68 having a plurality of high-power LED elements 74 gathered in the form of a point light source are arranged in multiple numbers to irradiate high-power heating light, it is possible to increase illuminance of the light on the wafer surface and to assure rapid heatup. More particularly, in the present invention, the wavelength of the light emitted from the LED elements 74 is set to fall within a wavelength band of 360 to 520 nm in which the dependency of reflection characteristics (absorption characteristics) of the light on the film kind is minor and in which the penetration length of the light in a wafer depth (thickness) direction is short enough to selectively heat only the wafer surface portion. This makes it possible to heat up only a shallow surface portion of the wafer at an increased rate while maintaining the in-plane uniformity of the wafer surface temperature. In this case, it is needless to say that the depth of the portion thus heated can be controlled by controlling the irradiation time period of the light.

During the process of annealing, cold thermal energy is generated on the bottom surface of the thermoelectric conversion devices 42 including Peltier elements. In order to remove this cold thermal energy, it is desirable to efficiently operate the thermoelectric conversion devices 42 by allowing a heat medium to flow through the heat medium flow passage 50 provided in the table main body 40.

Although the LED elements 74 of the heating apparatus 62 differ in light emitting pattern from a resistor type heater accompanied by a great deal of Joule heat, it is unavoidable that the LED elements 74 generate some heat by themselves. Owing to the fact that the element attachment rods 72 to which the LED elements 74 are attached are formed of heat pipes, the heat generated in the LED elements 74 is transferred to the base ends of the element attachment rods 72 and then transferred to the housing 64 made of aluminum or the like. Furthermore, heat is dissipated by allowing cooling water to flow through the coolant passage 84 of the attachment rod cooling unit 82 provided in the housing 64. This makes it possible to efficiently cool the LED elements 74 and the element attachment rods 72.

Further, since that most of the element attachment rods 72 formed of heat pipes extend in a direction perpendicular to the surface of the wafer W or in a direction substantially parallel to this perpendicular direction, it is possible to efficiently operate the heat pipes mainly by means of a gravity and, consequently, to increase cooling efficiency of the LED elements 74.

Seeing that the light emitted from the LED elements 74 of high light-emitting efficiency is efficiently reflected by the first reflectors 70 and the second reflector 66 and also uniformly irradiated on the wafer surface, it is possible to improve heating efficiency and to increase in-plane uniformity of a wafer temperature. Particularly, in case surfaces of the reflectors 66 and 70 are coated with an $MgF_2$ film, it is possible to increase the reflectivity thereof to perform a heating operation in a more efficient manner.

Once the annealing is performed for a specified short period of time in this manner, the wafer W is cooled as quickly as possible to prevent the impurities within the wafer W from diffusing excessively. In this case, with a view to rapidly lower the wafer temperature, an electric current is allowed to flow through the thermoelectric conversion devices 42 including Peltier elements in the opposite direction to the current flow direction during the heating process, thereby cooling the upper surfaces of the thermoelectric conversion devices 42. This ensures that the support plate 44 is cooled to thereby rapidly cool the wafer W. At this time, the lower surfaces of the thermoelectric conversion devices 42 are heated by hot thermal energy. For the purpose of cooling these lower surfaces, a cooling medium is allowed to flow through the heat medium flow passage 50 contrary to the wafer heating operation. This makes it possible to efficiently operate the thermoelectric conversion devices 42.

Simultaneously with the above-noted operation, the respective heating light sources 68 of the heating apparatus 62 provided in the housing 64 are turned off to cut off the electric power supplied thereto. At this time, the element attachment rods 72 and the LED elements 74 of the respective heating light sources 68 are cooled down because coolant, e.g., cooling water, continues to flow through the coolant passage 84 of the attachment rod cooling unit 82. In this regard, if a heating lamp is used as the wafer heating source, the wafer is unintentionally heated by the radiant heat generated by the heating lamp in itself. This is because the heating lamp has a great heat capacity and would be kept in a high temperature state even after it has been turned off. For this reason, a restriction is imposed on a cooldown rate and it is difficult to increase the cooldown rate even if a cooler is employed. However, in case of the present invention using the LED elements 74 whose intrinsic heat generation quantity is quite small and, furthermore, the LED elements 74 and the element attachment rods 72 are cooled by the attachment rod cooling unit 82. This makes it possible to not only reduce heat generation quantity of the LED elements in itself but also rapidly cool the LED elements, thereby reducing the radiant heat emitted by the same to a great extent. As a result, it becomes possible to greatly increase the cooldown rate of the wafer W and to realize high speed cooldown.

In this case, thanks to the fact that heat pipes are used as the element attachment rods 72 and most of the element attachment rods 72 are provided to extend in a direction perpendicular to the wafer surface or in a direction substantially parallel to this perpendicular direction so that the heat pipes can be operated in an efficient manner, it is possible to more effectively and efficiently cool the LED elements 74 and, consequently, to perform the high speed cool down at an increased rate. The present apparatus enables the wafer to be cooled at a high cooldown rate of, e.g., 100 to 150° C./sec. Furthermore, the LED elements 74 can be used longer than heating lamps.

Although the curved surface of the first reflector 70 provided in each of the heating light sources 68 has the shape of a spheroid in the foregoing embodiment, the shape of the first reflector 70 is not limited thereto but may be set to have a curved surface approximate to the spheroid, e.g., a paraboloid or a hemispherical surface.

Furthermore, the respective heating light sources 68 provided in the housing 64 may be divided into, e.g., a plurality of concentrically arranged groups, and the electric power supplied to the heating light sources 68 may be controlled on a group-by-group basis.

Moreover, the gas introducing unit 32 is not limited to the nozzle and it may be possible to use, e.g., a shower head structure made of a material transparent to the heating light, e.g., quartz.

In addition, although description has been made in the foregoing embodiment by taking as an example the case that the housing 64 is formed into a hemispherical curved shape (a dome-like shape), the housing 64 is not limited to this shape but may have a spheroid or a curved surface shape similar thereto. Additionally, the housing 64 may be formed into a planar shape, although the number of the heating light sources 68 attachable to the housing 64 is reduced in that case. In any event, the design of the housing 64 depends on the output power of the respective heating light sources 68 and the heating temperature of the wafer W.

Next, description will be given on the reason why the wavelength of the light emitted from the LED elements 74 employed in the present invention is limited to be within the range from 360 to 520 nm, i.e., within the range from purple light (including certain ultraviolet light) to blue light.

Figure 13:
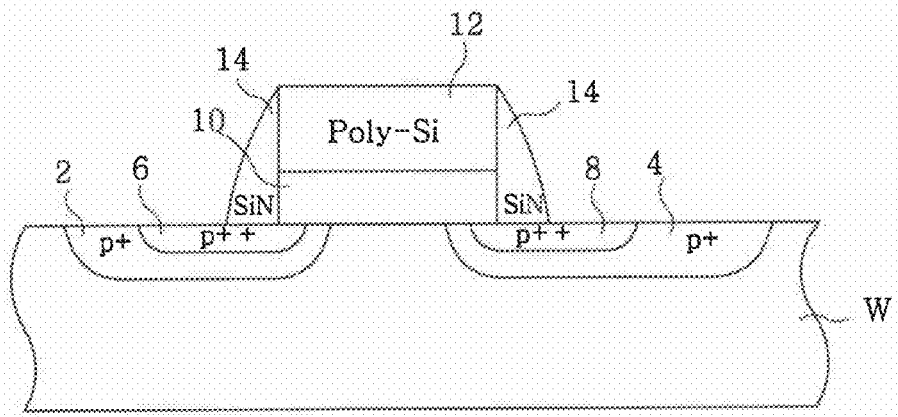
FIG. 13 is a view showing a gate structure, one representative example of typical transistor structures.
Figure 14:
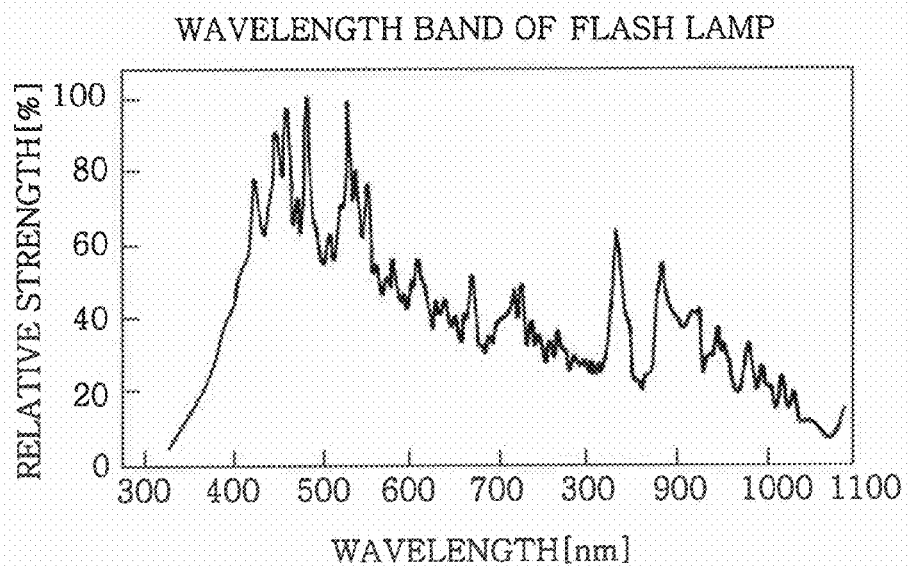
FIG. 14 is a view illustrating a wavelength band of a flash lamp.

As already described with reference to FIG. 13, impurity-doped diffusion regions including a source and a drain tend to have a greater impurity concentration and become shallower in an effort to meet the requirements for high speed operation and increased integration in the devices such as a transistor and the like.

Accordingly, in case of annealing the wafer, there is a need to rapidly heat up and cool down only the surface portion of the wafer so that the diffusion of impurities in a depth (thickness) direction of the wafer can be suppressed as much as possible. Furthermore, in order to suppress generation of lateral stresses in the minute regions of a wafer surface, it is necessary during the process of raising and lowering the wafer temperature to prevent the temperature distribution on the wafer surface from becoming non-uniform and, hence, to maintain the in-plane temperature uniformity as much as possible.

From the view points noted above, evaluation was conducted for the characteristics of each wavelength of the light.

Figure 7:
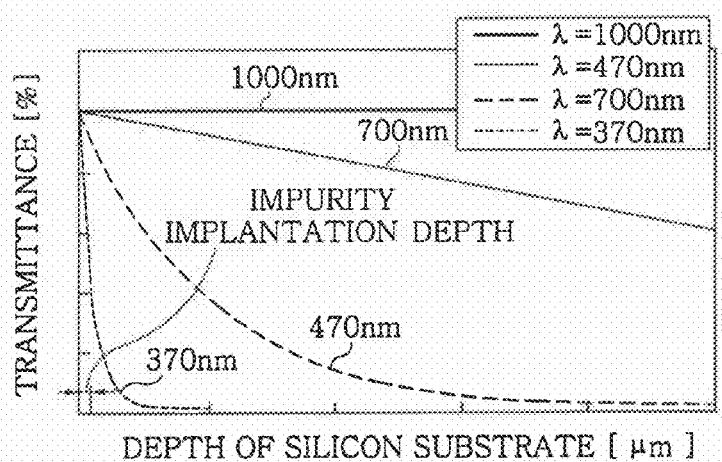
FIG. 7 is a graph representing the wavelength dependency of a penetration depth of light in a thickness direction (depth direction) of a silicon substrate.

First, evaluation was made on the wavelength dependency of a penetration depth of the light in a thickness direction (depth direction) of a silicon substrate as a semiconductor wafer. FIG. 7 is a graph representing the wavelength dependency of the light penetration depth in the thickness direction (depth direction) of the silicon substrate. In this evaluation, the wavelength was changed from 370 nm (including certain ultraviolet light) to 1000 nm and the light transmittance in the thickness direction (depth direction) of the silicon substrate at that time was measured. In this regard, an steep decrease of the transmittance in the depth direction means that only the surface portion of the wafer is heated, whereas a gentle decrease of the transmittance in the depth direction indicates that the wafer is heated up to the deep portion thereof. As is apparent from the graph, the shorter the wavelength, the greater the reduction of the transmittance in the depth direction. Therefore, it can be seen that, if the wavelength becomes shorter, it is possible to selectively heat only the surface portion of the wafer. In other words, it can be appreciated that, if the wavelength becomes longer, it is possible to heat the wafer up to the deep portion thereof. According to the recent design rule requirement, the implantation depth of impurities is set to be very shallow, which is about 50 nm from the wafer surface at the greatest. Thus, it can be noted that the deep portion of the wafer is undesirably heated at the wavelength of about 700 nm or longer and further that the wavelength of the light needs to be set shorter than about 470 nm (blue light).

Figure 8:
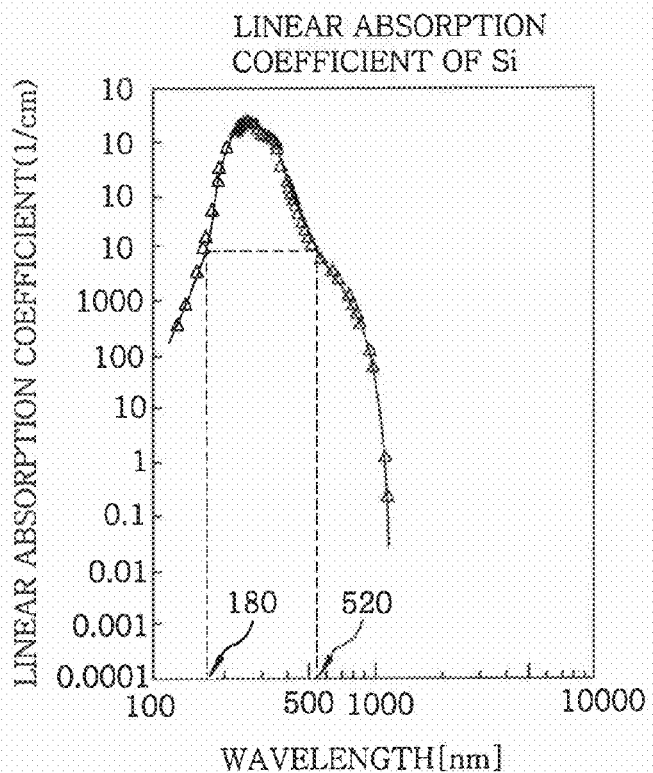
FIG. 8 is a graph representing the light wavelength dependency of a linear absorption coefficient of a silicon substrate.

In this regard, it is known that the light wavelength dependency of a linear absorption coefficient of the silicon substrate generally exhibits the characteristics as illustrated in FIG. 8, which is a graph representing the light wavelength dependency of the linear absorption coefficient of the silicon substrate. This graph shows a light wavelength in a range from 100 to 1000 nm. With this graph, the linear absorption coefficient reaches a peak at the wavelength of 300 nm (ultraviolet light) and gradually decreases before and after the peak. Therefore, it can be seen that the light having a wavelength of about 300 nm is capable of most efficiently heating the wafer. It can also be noted in this graph that, if the light wavelength is longer than about 520 nm or shorter than about 180 nm, the linear absorption coefficient grows too small and the wafer heating efficiency undergoes steep reduction.

Figure 9:
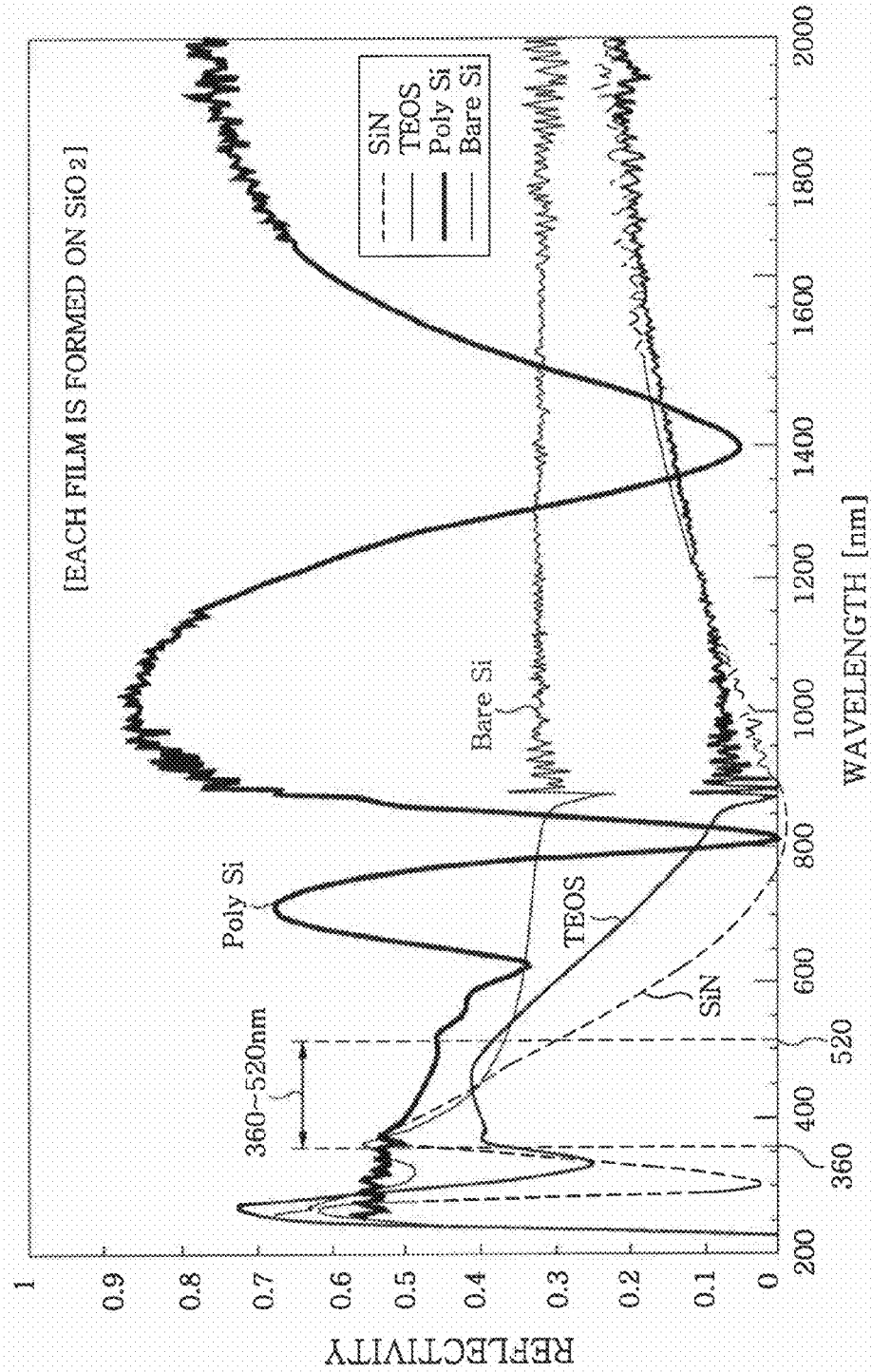
FIG. 9 is a graph representing the light wavelength dependency of a reflectivity of various kinds of films formed on a wafer surface.

Next, evaluation was conducted on the light wavelength dependency of a reflectivity of various kinds of films formed on the wafer surface. FIG. 9 is a graph representing the light wavelength dependency of the reflectivity of various kinds of films formed on the wafer surface. The difference in the reflectivity between the films, the smaller the difference in the heatup rate at which the films can be heated. In this evaluation, measurements were made of a SiN film, a TEOS-based silicon film and a polysilicon film respectively formed on a silicon oxide ($SiO_2$) film. For the purpose of reference, measurements were also conducted of a bare silicon film. It is assumed that the respective kinds of the films are exposed in the minute regions of the wafer surface as is the case in the transistor shown in FIG. 13.

As illustrated in FIG. 9, the reflectivity of the respective kinds of the films including the bare silicon film heavily fluctuates up and down in different patterns depending on the light wavelength. Analysis of the graph shows that the difference in the reflectivity of the films is smallest in the wavelength range from 360 to 520 nm in which range the reflectivity difference falls within about 0.15. This means that, even if a plurality of minute regions formed of different kinds of films exists on the wafer surface, the heatup operation can be performed under a uniform temperature distribution without causing a great temperature difference between the minute regions.

In other words, if the heatup operation is performed in a state that a great temperature difference or temperature distribution occurs between the minute regions formed of different kinds of films, high lateral stresses are developed between the minute regions by a thermal expansion difference. This leads to a fear that the device in itself is damaged in the worst circumstances. By setting the light wavelength within the range of 360 to 520 nm as set forth above, it is possible to prevent damage of the device in itself which would otherwise be caused by the temperature difference between the minute regions. In this case, it can be seen in FIG. 9 that the wavelength range from 400 to 470 nm is more preferable because the difference in the reflectivity of various kinds of films can be further reduced in that range.

Furthermore, this wavelength range from light, 360 to 520 nm, satisfies the restricted condition described earlier with reference to FIG. 7 (the wavelength shorter than about 470 nm) and the restricted condition set forth in respect of FIG. 8 (the wavelength range from 180 to 520 nm). As a result, it can be appreciated that the use of LED elements emitting light with a wavelength of 360 to 520 nm is preferable.

As described earlier, the LED elements practically used are adapted to emit light having a broad wavelength range from about 100 nm with respect to a central wavelength. Blue LED elements that emit blue light having a central wavelength of 470 nm are mass-produced at the present time. The use of these blue LED elements makes it possible to provide the apparatus of the present invention in a cost-effective manner. In addition to the above, it may be possible to use purple LED elements that emit purple light partially containing or not containing ultraviolet light and ultraviolet light LED elements that emit ultraviolet light. These LED elements may be provided in combination.

Figure 10:
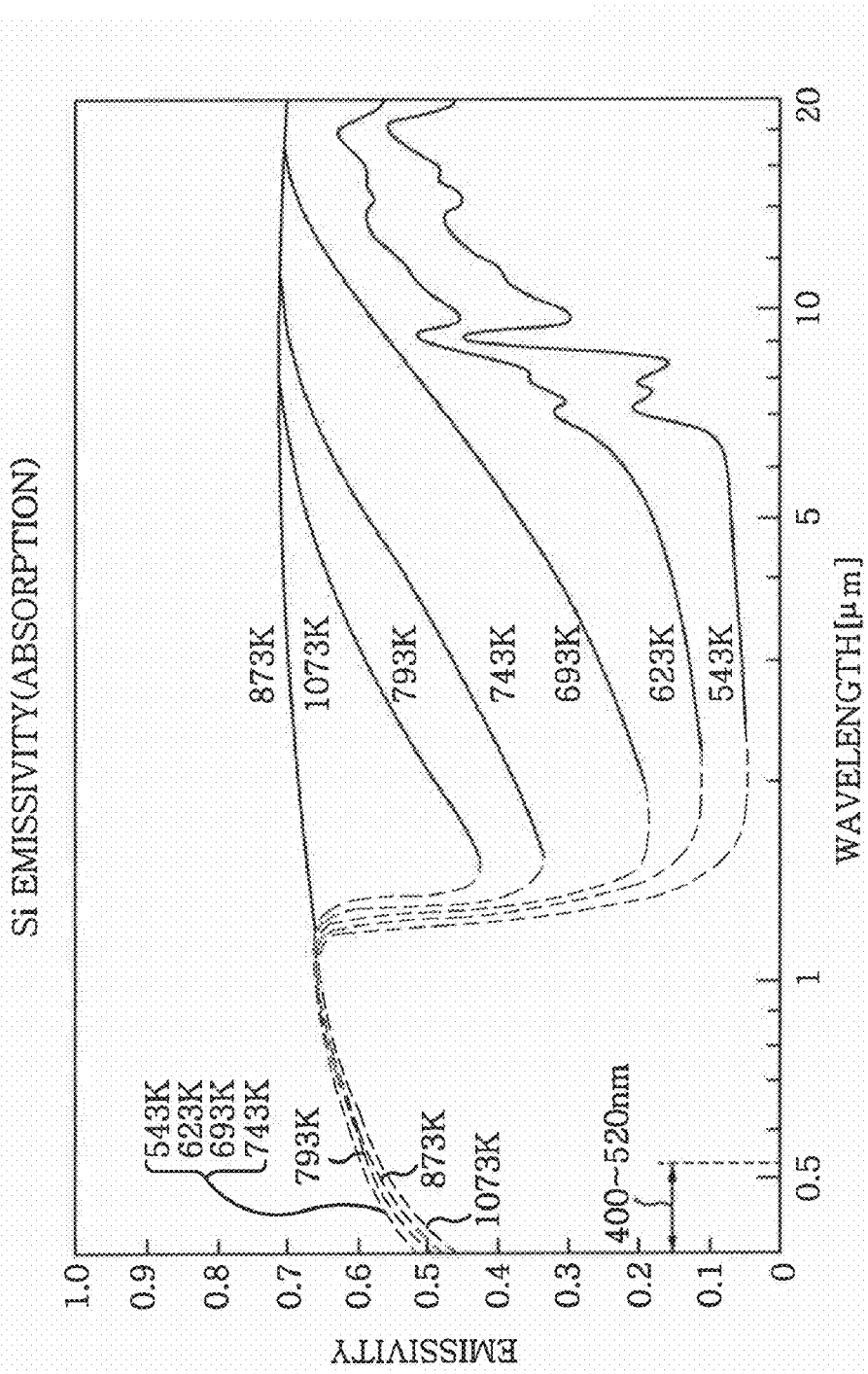
FIG. 10 is a graph representing the wavelength and temperature dependency of an emissivity (absorptance) of a silicon substrate.

Next, description will be given regarding the results of examination on the wavelength and temperature dependency of an emissivity (absorptance) of the silicon substrate in the light wavelength band of 360 to 520 nm determined as above. FIG. 10 is a graph representing the wavelength and temperature dependency of the emissivity (absorptance) of the silicon substrate. This graph is shown in T. Sato, Japanese Journal of Applied Physics, Volume 6 (1967), 339. The light wavelength ranging from around 0.4 μm (400 nm) to about 20 μm is indicated in this graph. It can be seen in FIG. 10 that, in the wavelength range from 400 to 520 nm (0.4 to 0.52 μm), the emissivity (absorptance) is kept at a high value of 0.5 to 0.6 throughout a wafer temperature range from 543 K (270° C.) to 1073 K (800° C.). This means that the wafer can be efficiently heated up from a low temperature to a high temperature at an increased emissivity (absorptance). Accordingly, it can be noted that the wafer can be efficiently heated up by heating the same with the light having a wavelength in the range from 360 to 520 nm as set forth above.

Figure 11:
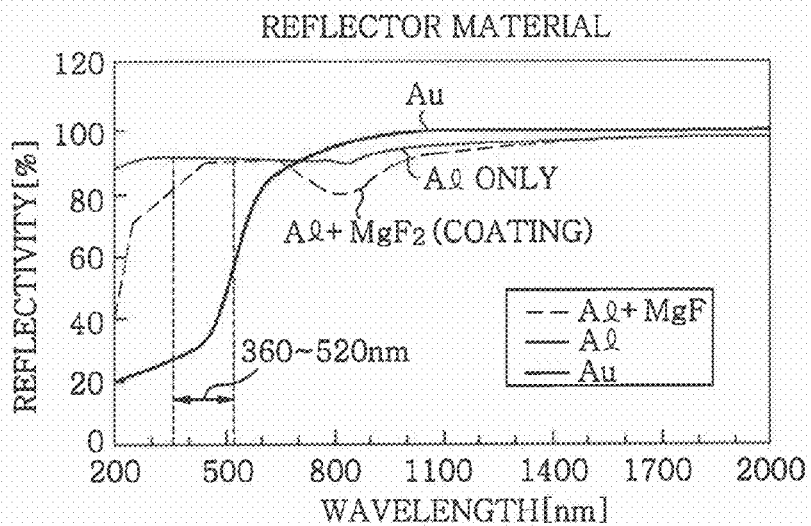
FIG. 11 is a graph representing the light wavelength dependency of a reflectivity of reflector materials.

Next, description will be given regarding the results of evaluation on reflector materials in the light wavelength band from 360 to 520 nm determined as above. FIG. 11 is a graph representing the light wavelength dependency of a reflectivity of the reflector materials.

Examination was conducted for a case of using Au (gold) as the reflector materials, a case of using only Al (including aluminum alloy) as the reflector materials, and a case of coating a MgF$_2$ (magnesium fluoride) film on a surface of Al (including aluminum alloy).

As is apparent from the graph, the use of Au is not very preferable because it exhibits a reflectivity of about 30 to 40% in the light wavelength range from 360 to 520 nm. In contrast, a high reflectivity of 80 to 90% is obtained in the case of using only Al and in the case of coating the MgF$_2$ (magnesium fluoride) film on the surface of Al (including aluminum alloy). This makes sure that these materials are suitable for the use as the first and second reflectors 70 and 66.

Figure 12:
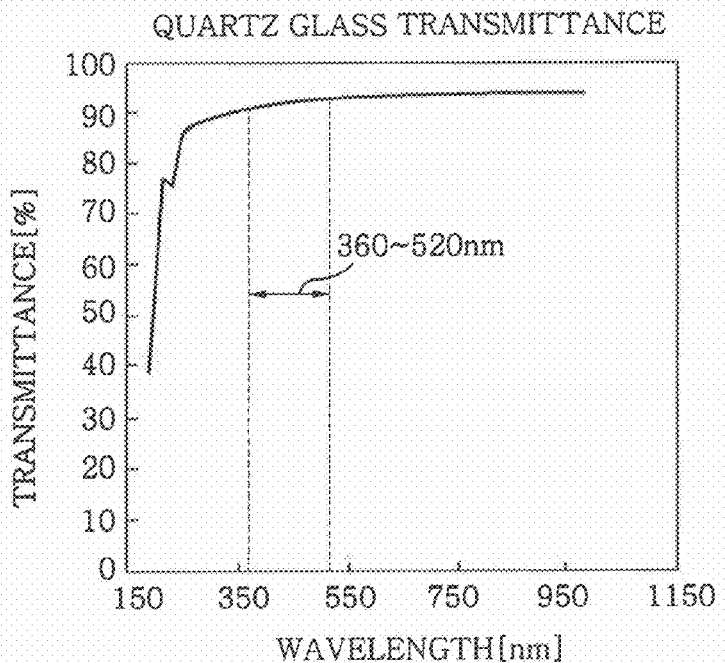
FIG. 12 is a graph representing the wavelength dependency of a transmittance of quartz glass.

Next, description will be given regarding the results of evaluation on a transmittance of quartz glass in the light wavelength band of 360 to 520 nm determined as above. FIG. 12 is a graph representing the wavelength dependency of the transmittance of quartz glass.

In this graph, the light wavelength is changed within a range from 150 to 950 nm. As is apparent from this graph, the quartz glass exhibits a high transmittance of about 90 to 94% in the light wavelength range from 360 to 520 nm. Accordingly, it can be appreciated that the quartz glass is suitable for the use as the light transmission window 28 constituting the ceiling portion of the processing chamber 24 because it exhibits reduced light absorptance and increased transmittance.

Although annealing has been described herein as an example of the heat treatment, the present invention is not limited thereto but may be applied to other heat treatments such as oxidation/diffusion, film forming, reforming, etching or the like.

Furthermore, although a semiconductor wafer has been described herein as an example of the object, the present invention is not limited thereto but may be applied to a glass substrate, an LCD substrate, a ceramics substrate and so forth.

What is claimed is:

1. A heating apparatus for heating a target object, comprising:
    a plurality of heating light sources including LED (Light Emitting Diode) elements each for emitting heating light toward the object, the heating light having a wavelength in a range from 360 to 520 nm; and
    a radiation thermometer that measures a temperature of the object, the radiation thermometer measuring a wavelength band different from a wavelength band of the light emitted from the LED elements.

2. The heating apparatus of claim 1, wherein the LED elements include at least one of ultraviolet LED elements for emitting ultraviolet light, purple LED elements for emitting purple light and blue LED elements for emitting blue light.

3. The heating apparatus of claim 2, wherein the blue LED elements emit the heating light having a central wavelength of 470 nm.

4. The heating apparatus of claim 1, further comprising first reflectors provided correspondingly to the respective heating light sources to reflect the light from the heating light sources toward the object.

5. The heating apparatus of claim 4, wherein the lights reflected from the first reflectors are adapted to be respectively collected onto different regions of the object.

6. The heating apparatus of claim 4, wherein each of the first reflectors is made of aluminum or formed by coating a magnesium fluoride film on an aluminum surface.

7. The heating apparatus of claim 1, wherein each of the heating light sources includes an element attachment rod formed of a heat pipe, the LED elements being attached to tip portions of the element attachment rods.

8. The heating apparatus of claim 1, wherein each of the heating light sources includes a base portion supported by a housing.

9. The heating apparatus of claim 8, wherein the housing is formed into a dome shape and has an inner curved reflection surface serving as a second reflector.

10. The heating apparatus of claim 9, wherein the second reflector is made of aluminum or formed by coating a magnesium fluoride film on an aluminum surface.

11. The heating apparatus of claim 8, wherein an attachment rod cooling unit for cooling the base portion of each of the heating light sources is provided in the housing.

12. The heating apparatus of claim 7, wherein the element attachment rod of each of the heating light sources is configured to extend in a direction perpendicular to a surface of the object or in a direction approximate to the perpendicular direction.

13. The heating apparatus of claim 1, wherein the heating light has a wavelength in a range from 400 to 470 nm.

14. The heating apparatus of claim 1, wherein the heating light emitted from each of the LED elements has a bandwidth of about 100 nm.

15. A heat treatment apparatus for performing a specified heat treatment to a target object, comprising:
    an exhaustible processing chamber having an open ceiling portion;
    a mounting table provided within the processing chamber for supporting the object on an upper surface thereof;
    a light transmission window for air-tightly covering the ceiling portion of the processing chamber;
    a gas introducing unit for introducing a required gas into the processing chamber; and
    a heating apparatus provided above the light transmission window for emitting heating light toward the object, wherein the heating apparatus includes:
- a heating light source having an LED element for emitting heating light toward the object, the heating light having a wavelength in a range from 360 to 520 nm, and
- a radiation thermometer that measures a temperature of the object, the radiation thermometer measuring a wavelength band different from a wavelength band of the light beams emitted from the LED elements.

16. The heat treatment apparatus of claim 15, wherein a plurality of thermoelectric conversion devices is provided in an upper portion of the mounting table.

17. The heat treatment apparatus of claim 15, wherein a heat medium flow passage for, if necessary, allowing heat medium to flow through the passage is provided in the table.

18. The heat treatment apparatus of claim 16, further comprising a control unit for controlling an overall operation of the heat treatment apparatus,
wherein the control unit controls the heat treatment apparatus in such a way that, when heating the object, the heating apparatus is turned on and an electric current is allowed to flow through the thermoelectric conversion devices in such a direction as to heat the object while, when cooling the object, the heating apparatus is turned off and an electric current is allowed to flow through the thermoelectric conversion devices in such a direction as to cool the object.

19. The heat treatment apparatus of claim 16, further comprising a control unit for controlling an overall operation of the heat treatment apparatus,
wherein the control unit controls the heat treatment apparatus in such a way that, when heating the object, the thermoelectric conversion devices are first turned on to preheat the object by allowing an electric current to flow in such a direction as to heat the object and then the heating apparatus is turned on while, when cooling the object, the heating apparatus is turned off and an electric current is allowed to flow through the thermoelectric conversion devices in such a direction as to cool the object.

20. The heat treatment apparatus of claim 15, wherein the heating light has a wavelength in a range from 400 to 470 nm.

21. The heat treatment apparatus of claim 15, wherein the heating light emitted from each of the LED elements has a bandwidth of about 100 nm.

* * * * *